US 8,135,976 B2

(12) United States Patent
Brown et al.

(10) Patent No.: US 8,135,976 B2
(45) Date of Patent: Mar. 13, 2012

(54) MODULATED CLOCK, AN IC INCLUDING THE MODULATED CLOCK AND A METHOD OF PROVIDING A MODULATED CLOCK SIGNAL FOR POWER CONTROL

(75) Inventors: Jeff S. Brown, Fort Collins, CO (US);
Mark F. Turner, Longmont, CO (US);
Jonathan Byrn, Fort Collins, CO (US);
Paul Dorweiler, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 568 days.

(21) Appl. No.: 12/337,551

(22) Filed: Dec. 17, 2008

(65) Prior Publication Data

US 2010/0150271 A1  Jun. 17, 2010

(51) Int. Cl.
*G06F 1/04* (2006.01)
(52) U.S. Cl. ...................................................... 713/500
(58) Field of Classification Search .......... 713/300–340, 713/500
See application file for complete search history.

(56) References Cited

U.S. PATENT DOCUMENTS

| | | | |
|---|---|---|---|
| 7,320,599 B2 * | 1/2008 | Morris | 434/262 |
| 7,451,332 B2 * | 11/2008 | Culbert et al. | 713/320 |
| 7,698,583 B2 * | 4/2010 | Gaskins et al. | 713/300 |
| 7,822,998 B2 * | 10/2010 | Cai | 713/322 |
| 2005/0138444 A1 * | 6/2005 | Gaskins | 713/300 |
| 2005/0144486 A1 * | 6/2005 | Komarla et al. | 713/300 |
| 2008/0005381 A1 * | 1/2008 | Theocharous et al. | 710/18 |

* cited by examiner

*Primary Examiner* — Raymond Phan

(57) ABSTRACT

A modulated clock, a method of providing a modulated clock signal, an integrated circuit including a modulated clock and a library of cells including a modulated clock. In one embodiment, the modulated clock includes (1) a clock controller configured to generate a digital control stream and (2) clock logic circuitry having a first input configured to receive a clock signal and a second input configured to receive the digital control stream. The clock logic circuitry is configured to provide a modulated clock signal in response to the clock signal and the digital control stream, wherein the modulated clock signal has an effective frequency that differs from the first frequency.

32 Claims, 4 Drawing Sheets

MODULATED CLOCK, AN IC INCLUDING THE MODULATED CLOCK AND A METHOD OF PROVIDING A MODULATED CLOCK SIGNAL FOR POWER CONTROL

TECHNICAL FIELD

This application is directed, in general, to integrated circuit (IC) power control and, more specifically, to reducing power consumption of ICs.

BACKGROUND

Manufacturers of electronic circuits, and especially ICs, are sensitive to the need to improve the energy efficiency of their products. Reducing the use of power in ICs is one area manufacturers are trying to improve energy efficiency. For ICs using complementary metal-oxide semiconductor (CMOS) field-effect transistors (FETs) (i.e., CMOS ICs) power consumption is a product of dynamic power (i.e., signals or clocks changing values) and static power (i.e., power that is consumed even when all signals and clocks are static). Although modern CMOS IC fabrication technologies are increasingly requiring more static power, dynamic power consumption is still a significant portion of the total consumed power. Therefore, reducing dynamic power consumption would prove beneficial to reducing the overall power consumption of an IC.

SUMMARY

One aspect provides a modulated clock for an integrated circuit. In one embodiment, the modulated clock includes (1) a clock controller configured to generate a digital control stream and (2) clock logic circuitry having a first input configured to receive a clock signal and a second input configured to receive the digital control stream. The clock logic circuitry is configured to provide a modulated clock signal in response to the clock signal and the digital control stream, wherein the modulated clock signal has an effective frequency that differs from the first frequency.

In another aspect, a method is disclosed for providing a modulated clock signal for at least a portion of an integrated circuit. In one embodiment, the method includes: (1) receiving a clock signal having a first frequency, (2) generating a digital control stream and (3) providing a modulated clock signal in response to the clock signal and the digital control stream, wherein the modulated clock signal has an effective frequency that is different than the first frequency.

In yet another aspect, an integrated circuit is provided. In one embodiment, the IC includes: (1) a clock configured to generate a base clock signal having a first frequency, (2) a logic block of logic elements that are driven by a clock signal and (3) a modulated clock. The modulated clock includes: (3A) a clock controller configured to generate a digital control stream and (3B) clock logic circuitry configured to receive the digital control stream and the base clock signal and further configured to employ the digital control stream to reduce clock pulses of the base clock signal to provide a modulated clock signal for the logic block, the modulated clock signal having an effective frequency that is less than the first frequency.

In still another aspect, a library of standard cells is provided including a modulated clock signal.

BRIEF DESCRIPTION

Reference is now made to the following descriptions taken in conjunction with the accompanying drawings, in which.

DETAILED DESCRIPTION

Typically, clock distribution is 30% to 40% of the total dynamic power of a CMOS IC. In a synchronous IC design, data and control signals toggle (switch values) due to a clock transition. The effective toggling frequencies of the data and controls signals, therefore, are directly related to the clock frequency. Reducing the clock frequency therefore reduces the switching frequencies of all of the data signals in a design as well as the clock.

Since the data changes values on a clock transition, the clock frequency in a synchronous circuit may be directly (linearly) related to the dynamic power. This relationship is represented in Equation 1:

$$P = CV^2F \qquad \text{(Equation 1)}$$

where C is the effective capacitance being switched, V is the voltage being switched and F is the effective switching frequency. Dynamic power, therefore, can be reduced by reducing any of the components C, V or F. Disclosed herein is a system and method to reduce power consumption by reducing the effective switching frequency.

To reduce the effective switching frequency, this disclosure provides using a digital control stream to effectively reduce the clock speed of an IC without ever actually changing the frequency of the clock. For instance, by eliminating every $10^{th}$ clock cycle systematically, the internal effective operating frequency of a modulated clock signal can be 90% of the full speed unaltered clock signal provided by a base clock. The digital control stream can be generated using Pulse Code Modulation (PCM). The PCM can vary throughout the operation of the IC for different uses, so that the effective internal frequency can be varied as desired without altering the base clock itself. When employing PCM, the encoding can be simple and repetitive to simplify interfacing with other logic not using the modulated clock signal. Alternatively, the encoding can be complex and infrequently repeating to reduce Electro Magnetic Interference (EMI) on specific frequency bands due to the code harmonics.

The disclosure provides power control of very fine resolution that may only be limited by the thermal impedance of the IC. In addition, the disclosed scheme allows controlling power surges at system start-up and shut-down. Furthermore, the disclosed clock controlling system allows dynamic adjustment of the power of a device while it is actively running.

Figure 1:
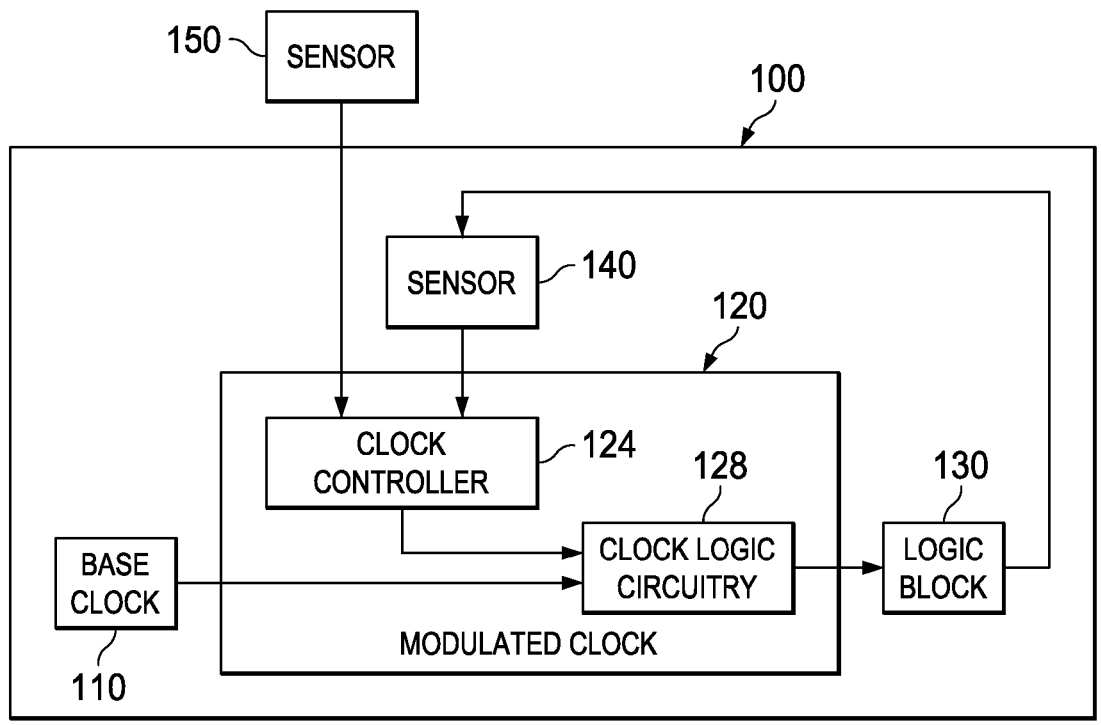
FIG. 1 is a block diagram of an embodiment of an IC constructed according to the principles of the present invention.

FIG. 1 is a block diagram of an embodiment of an IC 100 constructed according to the principles of the present invention. The IC 100 is formed on or in (those two terms being defined herein as equivalent) a substrate (indicated by an unreferenced box surrounding the IC 100). The IC 100 is a CMOS IC. Located on the substrate is a base clock 110, a modulated clock 120 and a logic block 130. In alternative embodiments, a base clock that is not part of the IC 100 (i.e., off chip) may be used. Also illustrated is a sensor 140 of the IC 100 and another sensor 150 external to the IC. The IC 100 may also include additional components or devices that are typically included on an IC.

The base clock 110 and the logic block 130 represent conventional components of an IC. The base clock 110 may be a conventional clock used in an IC configured to generate a clock signal (referred to as a base clock signal) for the IC 100. For example, the base clock 110 may be a master clock or a root clock of the IC 100. The base clock 110 can provide the clock signal at a constant frequency. The base clock 110 may be a silicon-based timing device or a quartz-crystal oscillator. The logic block 130 includes logic circuitry of the IC 100 that is under the control (i.e., synchronous circuitry) of the modulated clock 120. The IC 100 may include multiple logic blocks that receive different modulated clock signals from the modulated clock 120 with the different modulated clock signals having different effective frequencies.

The modulated clock 120 is configured to effectively reduce the clock speed of the clock signal from the base clock 110 to provide a modulated clock signal for the logic block. The modulated clock 120 includes a clock controller 124 and clock logic circuitry 128. The clock controller 124 is configured to provide a digital control stream to the clock logic circuitry 128.

The digital control stream is a series of "ones" and "zeros" that are sequenced together to effectively reduce the frequency of the base clock signal when combined therewith. In one embodiment, the clock controller 124 may include digital control logic configured to generate the digital control stream, using information from the sensors 140, 150, to determine the relative proportions of "ones" and "zeroes" in the digital control stream. For example, the sensor 140 may be a temperature sensor having an output proportional to the temperature such that a high temperature results in a high output value, then to cool off the IC 100 the clock controller 124 can receive high sensor input values and translate those values into digital control streams that have patterns with more "zeroes." One skilled in the art will understand that control theory will be considered to keep the system from oscillating since a feedback control loop is used.

In response to the digital control stream and the base clock signal, the clock logic circuitry 128 provides the modulated clock signal at an output thereof. The clock controller 124 may employ PCM to generate the digital control stream. As such, the digital control stream may be considered as PCM code. In one embodiment the clock controller 124 includes a Delta-Sigma analog-to-digital converter (ADC) to generate the digital control stream. The Delta-Sigma ADC (which may also be referred to as a Sigma-Delta ADC) can be used to directly drive the clock logic circuitry 128.

The clock logic circuitry 128 is configured to receive the clock signal and the digital control stream and generate the modulated clock signal in response thereof. The clock logic circuitry 128 is configured to employ the digital control stream to effectively delete some of the clock pulses of the base clock signal to provide the modulated clock signal that has an effective frequency that differs from the base clock signal. The modulated clock signal may be used to reduce power consumption of the logic block 130 for temperature control of the die or to maintain overall power goals for the IC 100. As such, the modulated clock 120 may employ sensors and use the data therefrom to generate the digital control stream.

The sensor 140 may be a temperature sensor that is used by the modulated clock 120 to provide a modulated clock signal in response to the temperature of the IC 100 (or logic block 130). The modulated clock 120 may also use other inputs or sensors to influence the generation of digital control streams. For example, the modulated clock 120 may use an off chip sensor such as sensor 150. The sensors employed by the modulated clock 120 may be on or off chip current monitors or an on chip process monitor.

Figure 2:
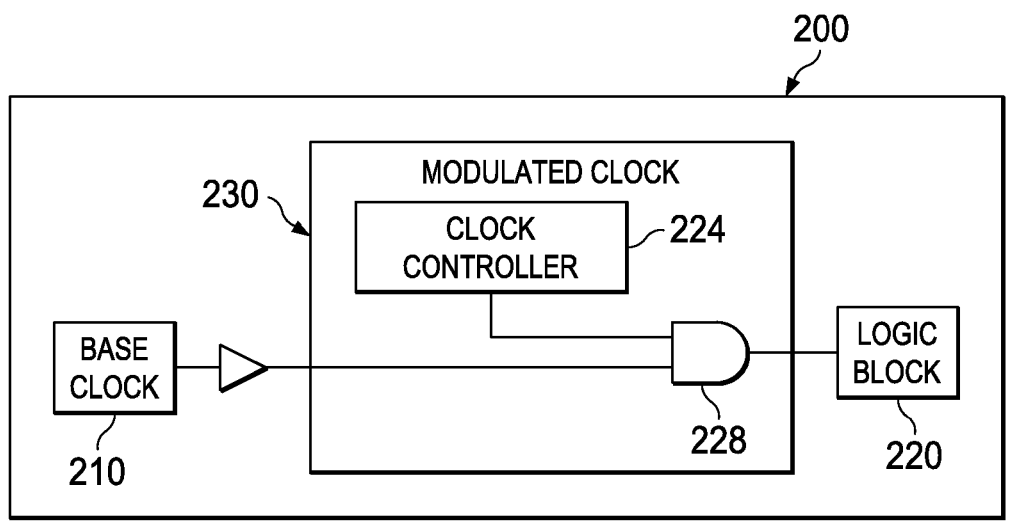
FIG. 2 is a block diagram of an IC including an embodiment of a modulated clock constructed according to the principles of the present invention.

FIG. 2 is a block diagram of another embodiment of an IC 200 including a modulated clock 230 constructed according to the principles of the present invention. The IC 200 also includes a base clock 210 (and an associated buffer) and a logic block 220. The base clock 210 may be a conventional IC clock that provides a base clock signal. The logic block 220 is a group of logic elements (e.g., flip-flops, latches, etc.) that are under the control of (or driven by) the modulated clock 230. The logic block 220 may be a subset of the logic elements of the IC 200.

The modulated clock 230 is configured to provide a modulated clock signal for the logic block 220 to reduce the dynamic power required by the logic block 220. By reducing the number of clock pulses of a base clock signal, the modulated clock 230 can deliver a modulated clock signal to the logic block that has an effective frequency less than the frequency of the base clock signal. The modulated clock 230 includes a clock controller 224 and clock logic circuitry 228.

The clock controller 224 is configured to generate a digital control stream. The digital control stream is used by the clock logic circuitry 228 to control the dynamic power of the logic of the IC 200 under the control of the modulated clock 230 (i.e., the logic block 220) by preventing the delivery of some of the clock pulses of the base clock signal to the logic block 220. Patterns of the digital control stream can vary depending on, for example, power requirements of the logic block 220 or the IC 200. Patterns of the digital control stream can be deterministic or random. Deterministic (i.e., using a counter or a masking pattern derived from a look-up table) might help with interfacing with other logic of the IC 200 that may be employing the same root clock (e.g., base clock) but not under the same digital control stream. A digital control stream having a random pattern can help reduce harmonic frequency emissions (EMC). Examples of digital control streams are provided in FIGS. 3A and 3B.

The clock controller 224 may be pre-programmed to provide a digital control stream for the start-up or the shut-down of clock signals. Additionally, the clock controller 224 may be programmed to control power for different operating conditions of the IC 200. A JTAG scan chain of the IC 200 (not illustrated) can be used to pre-load operating requirements for the clock controller 224. Additionally, dynamic controls can be used by the clock controller 224. For example, temperature information about the IC 200 may be provided to the clock controller 224.

The clock controller 224 may be implemented as a state machine. In one embodiment, the clock controller 224 may be a counter configured to mask clock pulses (e.g., mask every 10th clock pulse). In other embodiments the clock controller 224 may generate more complex masking schemes using, for example, a Delta-Sigma ADC. The clock controller 224 may use a repetition string of data derived from a Delta-Sigma ADC to either directly drive the clock logic circuitry 228 or to use with a look-up-table to select a digital control stream to apply to the clock logic circuitry 228. The clock controller 224, therefore, may be implemented in various degrees of complexity.

The clock logic circuitry 228 is configured to receive the base clock signal and the digital control stream and provide the modulated clock signal in response thereto. In FIG. 2, the clock logic circuitry 228 is an AND gate. The AND gate includes a first output, a first input configured to receive the base clock signal and a second input configured to receive the digital control stream. The AND gate provides the modulated clock signal at the output in response to the base clock signal and the digital control stream. The modulated clock signal has an effective frequency that differs from the frequency of the base clock signal.

Figure 3A:
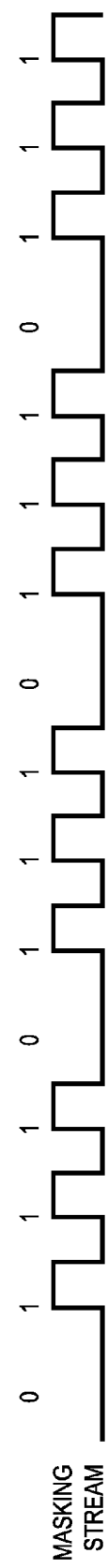
FIGS. 3A and 3B represent embodiments of digital control streams that can be employed by modulated clocks constructed according to the principles of the present invention.
Figure 3B:
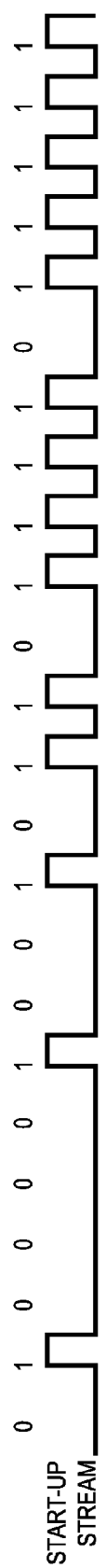

FIGS. 3A and 3B represent embodiments of digital control streams that can be employed by modulated clocks constructed according to the principles of the present invention. FIG. 3A represents a digital control stream as a masking stream having a masking pattern. A clock controller may generate the masking stream using a counter or derive the masking stream from a look-up table. A digital control stream having a masking pattern may assist with the interfacing between logic blocks on the same base clock but under the control of different modulated clock signals.

FIG. 3B represents a digital control stream that can be used for the start-up of a logic block. In FIG. 3B, the occurrence of the pulses (i.e., "ones" or logical high values) of the digital control stream increase to allow the dynamic power requirement for the logic block to ramp-up. A digital control stream allowing a ramp-down of the dynamic power requirement for the logic block would decrease until a stream of "zeros" (i.e., logical low values) would be provided. Ramp-up and ramp-down times may be dependant on system impedance for the power network. By having the digital control stream "mask" the clock with a progression of "ones" (1's) or "zeros" (0's), the dynamic power in the logic of the IC will smoothly increase or decrease without demanding a step in the required current. By ramping-up or ramping-down, large current fluctuations of the power supply for the IC 200 and the associated noise, also referred to as "step-load," can be avoided. The modulated clock 230, therefore, can be used to avoid or at least reduce current surges when gating clocks or re-enabling clocks.

Figure 4:
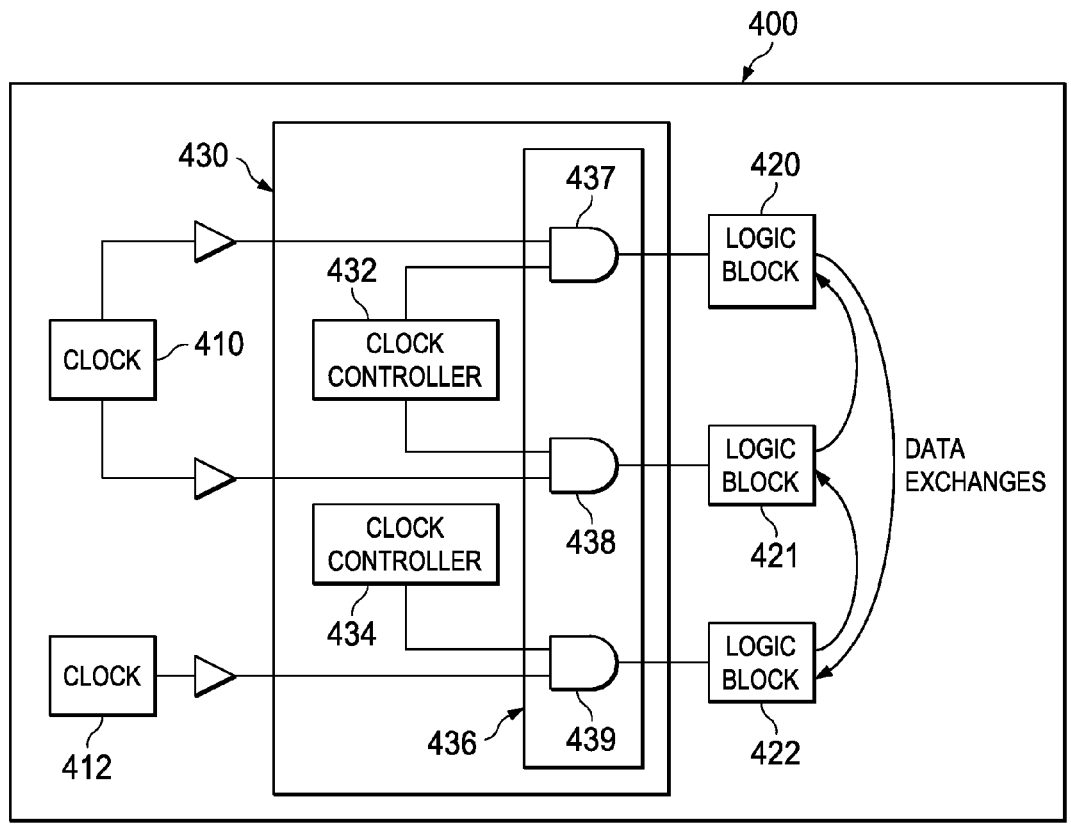
FIG. 4 is a block diagram of an IC including another embodiment of a modulated clock constructed according to the principles of the present invention.

Modulated clocks may include multiple clock controllers working with different digital control streams with relatively simple hand-shaking between the controlled logic since the clocks for the different subsets of logic are derived from the same base clock and are therefore relatively synchronous. This is in contrast to having varying frequencies for different subsets of logic on the same chip, which requires fully asynchronous interfaces. FIG. 4 illustrates a modulated clock having multiple clock controllers.

FIG. 4 is a block diagram of another embodiment of an IC 400 including a modulated clock 430 constructed according to the principles of the present invention. The modulated clock 430 is presented in the environment of the IC 400 that also includes clocks 410, 412, with associated buffers and logic blocks 420, 421, 422. The modulated clock 430 is configured to provide multiple modulated clock signals for the logic blocks 420, 421, 422, of the IC 400. The modulated clock 400 includes a first clock controller 432, a second clock controller 434 and clock logic circuitry 436. The clock logic circuitry 436 includes three AND gates designated 437, 438, 439.

The first clock controller 432 is configured to provide digital control streams for AND gates 437 and 438. Each AND gate 437, 438, receives their respective digital control streams and a base clock signal from the base clock 410. In response thereof, the AND gates 437, 438, provide modulated clock signals. AND gate 437 provides a modulated clock signal for the logic block 420. AND gate 438 provides a modulated clock signal for logic block 421.

The clock controller 432 may provide the same digital control stream for each of the AND gates 437 and 438. In some embodiments, the clock controller 432 may provide different digital control streams for each of the AND gates 437, 438. The clock controller 432 can coordinate the digital control streams to allow for the exchange of data between the logic blocks 420 and 421. For example, the clock controller 432 may direct both of the digital control streams for the AND gates 437 and 438 to be exactly the same when data is known to be exchanged. Alternatively, more complicated interacting patterns may be used to lower the peak noise and power requirements whenever possible, such as delivering a digital control stream of "10" to AND gate 437 and "01" to AND gate 438 if data is being exchanged from logic block 420 to logic block 421. This allows data to be passed but averages the power by first having the modulated clock from AND gate 437 pulse, then having the modulated clock from AND gate 438 pulse in succession rather than having them both pulse at the same time.

The clock controller 434 also provides a digital control stream that is used by the clock logic circuitry 436. More specifically, the clock controller 434 provides a digital control stream for the AND gate 439. The AND gate 439 receives the digital control stream and a base clock signal from the base clock 412. In response thereof, the AND gate 439 provides a modulated clock signal for the logic block 422.

As illustrated, base clock 410 provides a base clock signal for logic blocks 420, 421, and base clock 412 provides a base clock signal for logic block 422. As such, if data needs to be exchanged between logic block 422 and logic blocks 420 or 421, then synchronization may be required between the exchanging logic blocks before data can be transferred. In some embodiments, the base clocks 410 and 412 may be the same base clock. Thus, the logic block 422 may be fundamentally synchronous to both logic blocks 420 and 421. However, when trying to exchange data between logic block 422 and logic blocks 420 or 421, data may try to pass to the other blocks when these blocks are not receiving a clock pulse and vice versa. As such, the clock controllers 432, 434, may be configured to coordinate the digital control signals that are provided to allow for the exchange of data. For example, the clock controller 432, the clock controller 434 or a combination of both the clock controllers 432, 434, may coordinate the digital control streams by forcing missing clock cycles to only occur when data is not being passed back and forth between logic block 422 and logic blocks 421 or 420.

Figure 5:
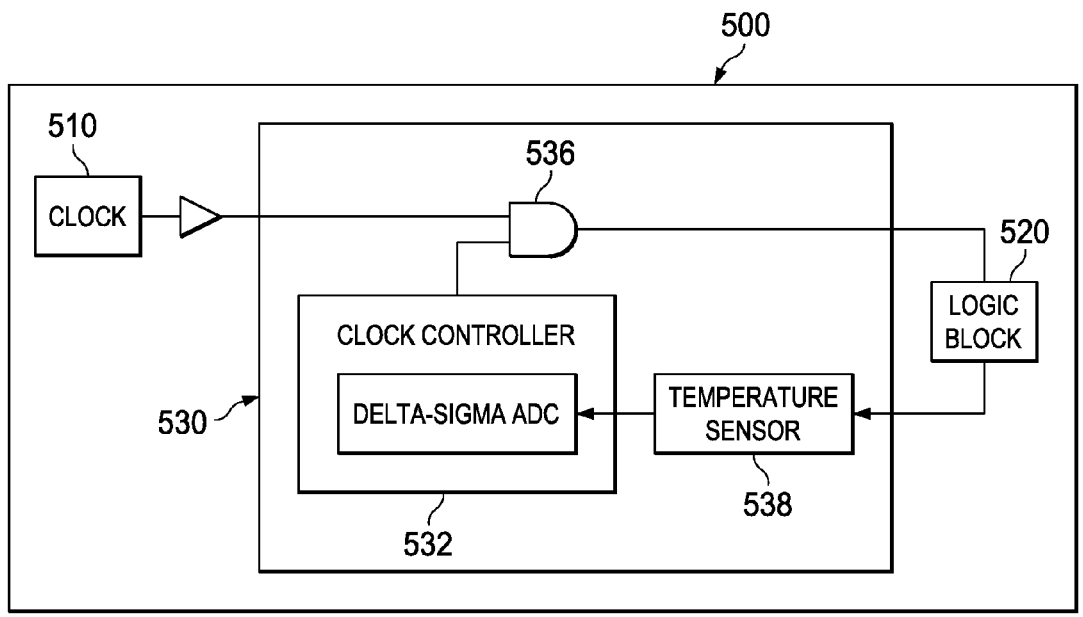
FIG. 5 is a block diagram of an IC including yet another embodiment of a modulated clock constructed according to the principles of the present invention.

In some embodiments, a modulated clock may employ data from some sensing device as a proxy for directly measuring power in an IC to control the power of the IC. For example, if die temperature needs to be kept below some threshold, then an on-chip temperature sensor can be used to influence the digital control stream (such as a PCM code) in a closed-loop feedback system. The temperature sensor could be directly connected to a Delta-Sigma ADC and the ADC's full-scale and zero-scale ranges tuned to directly (or indirectly using some DSP filtering) drive clock logic circuitry of a modulated clock. FIG. 5 discussed below represents an embodiment using a temperature sensor. A modulated clock may also use other inputs or sensors, such as on or off chip current measurements or an on chip process monitor, to influence the generation of digital control streams.

FIG. 5 is a block diagram of yet another embodiment of an IC 500 including a modulated clock 530 constructed according to the principles of the present invention. The IC also includes a base clock 510 and a logic block 520. The modulated clock 530 is configured to provide a modulated clock signal for the logic block 520. The modulated clock 530 includes a clock controller 532, clock logic circuitry 536 and a temperature sensor 538. The clock logic circuitry 536 is an AND gate. As such the clock logic circuitry 536 will be referred to herein as the AND gate 536.

The clock controller 532 includes a Delta-Sigma ADC that is employed to produce a digital control stream (PCM code) for the AND gate 536 The clock controller 532 may include additional logic that is used to control the Delta-Sigma ADC, such as to satisfy loop stability using control theory for this closed-loop system. In addition to the digital control stream, the AND gate 536 also receives a base clock signal from the base clock 510. In response thereof, the AND gate 536 provides a modulated clock signal for the logic block 520.

In FIG. 5, the temperature sensor 538 is part of the modulated clock 530. In other embodiments, the temperature sensor 538 may be external to the modulated clock 530. Either way, the temperature sensor 538 forms part of a temperature locked loop (TLL) that provides feedback for the clock controller 532 to use in generating the digital control stream. The Delta-Sigma ADC can generate the digital control stream in response to temperature data from the temperature sensor 538.

As such, the temperature sensor 538 can be part of an on-die, closed loop control system employed to control dynamic power of the IC 500. The on-die temperature of the IC 500 can be used by the modulated clock 530 when controlling dynamic power by reducing the effective frequency of the base clock signal. The temperature sensor 538 can provide data to the Delta-Sigma ADC taking into account power dissipation, thermal impedance of the IC 500 and ambient temperature surrounding the IC 500. The Delta-Sigma ADC may need to be adjusted so that the ADC's full-range and minimum-range scale values would effectively apply the appropriate loop gain. Extra DSP filtering of the ADC data stream may be used to allow non-linear transforms to control the clock power. In FIG. 5, the loop gain of the TLL depends on thermal impedance of the IC 500.

Figure 6:
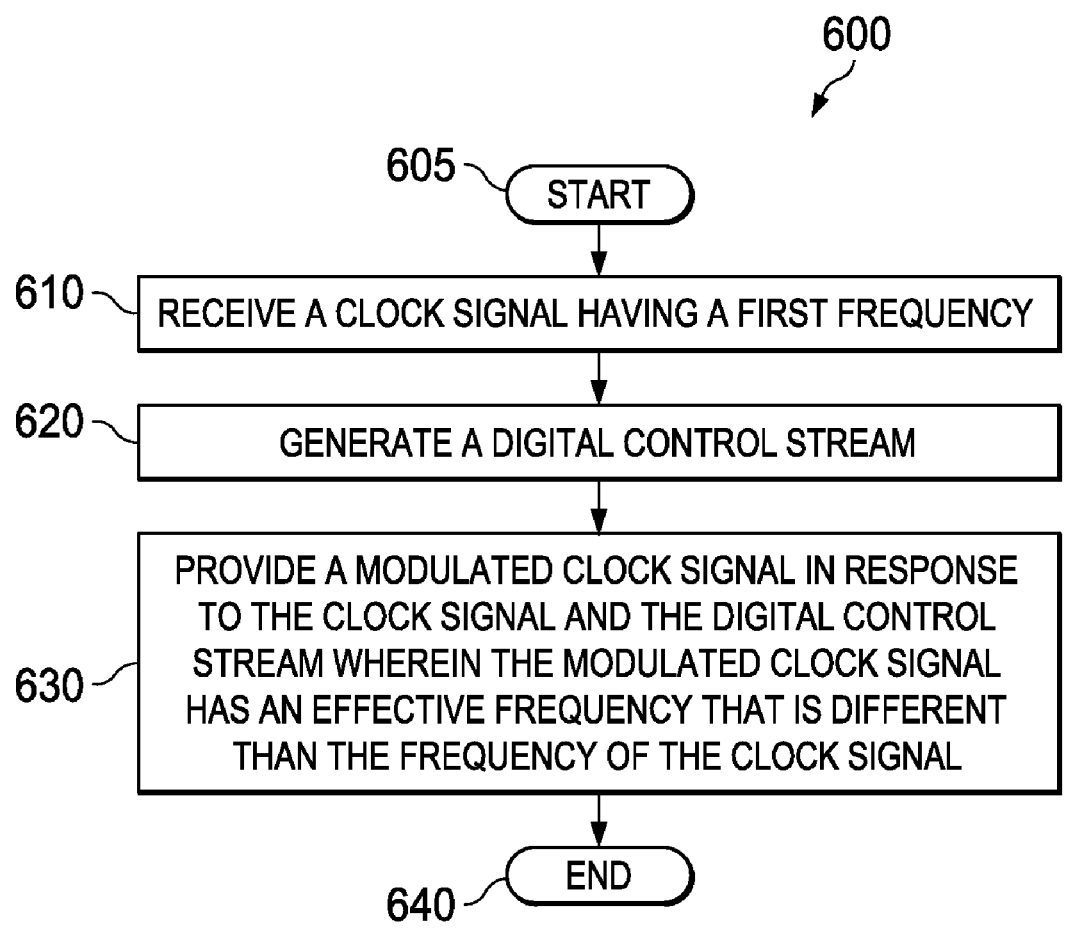
FIG. 6 is a flow diagram of a method of providing a modulated clock signal carried out according to the principles of the present invention.

FIG. 6 is a flow diagram of a method 600 of providing a modulated clock signal for an IC carried out according to the principles of the present invention. The method begins in a step 605. In a step, 610, a clock signal having a first frequency is received. The clock signal may be generated by a base clock of the IC. A digital control stream is generated in a step 620. The digital control stream is a series of zeros and ones that are used to reduce the number of clock pulses of the clock signal that are provided to the IC (or at least a portion of the IC). PCM may be used to provide the digital control stream.

In a step 630, a modulated clock signal is provided in response to the clock signal and the digital control stream. The modulated clock signal has an effective frequency that is different than the frequency of the clock signal. The digital control stream is used to reduce the effective frequency of the clock signal by cancelling out some of the clock pulse thereof. Combinatorial logic, such as an AND gate, may be used to receive the digital control stream and the clock signal. After providing the modulated clock signal, the method ends in a step 640.

Provided above are modulated clocks and clock controlling schemes that can be used to reduce the effective clock frequency of a base clock signal. The modulated clocks may use PCM to generate digital control streams (i.e., PCM code) to reduce the effective clock frequency and thus power for ICs (such as CMOS IC's). The PCM scheme may be implemented simply (i.e., drop every other clock for a 50% reduction in power) or may be implemented in a very complex way, such as using a pseudo-random data stream as a mask to reduce harmonic frequency emissions. The PCM scheme may also be dynamic and changing, so that the power can be modulated as in system start-up or shut-down, or for other reasons due to inputs such as temperature or current. Multiple modulated clocks may be used on an IC for different clusters of logic, either with some knowledge of PCM schemes passing between the different modulated clock implementations or without knowledge but adding some hand-shaking to recognize valid data transfers.

The modulated clocks may be implemented using existing IC design tools, including RTL and synthesis. The various disclosed modulated clocks, therefore, can be included in a library of cells allowing implementations in designs to reduce dynamic power of ICs.

Those skilled in the art to which this application relates will appreciate that other and further additions, deletions, substitutions and modifications may be made to the described embodiments.

What is claimed is:

1. A modulated clock for an integrated circuit, comprising:
   a clock controller configured to generate a digital control stream; and
   clock logic circuitry having a first input configured to receive a clock signal having a first frequency and a second input configured to receive said digital control stream, said clock logic circuitry configured to provide a modulated clock signal in response to said clock signal and said digital control stream, wherein said modulated clock signal has an effective frequency that differs from said first frequency and said digital control stream is a pseudo-random data stream generated to reduce harmonic frequency emissions.

2. The modulated clock as recited in claim 1 wherein said clock controller is a pulse code modulation clock controller including an analog-to-digital converter.

3. The modulated clock as recited in claim 1 wherein said clock logic circuitry further comprises a third input configured to receive an additional digital control stream that differs from said digital control stream and a fourth input configured to receive said clock signal, said clock logic circuitry further configured to provide an additional modulated clock signal in response to said clock signal and said additional digital control stream, said additional modulated clock signal having an effective frequency that is different than said first frequency.

4. The modulated clock as recited in claim 1 wherein said clock controller is further configured to generate said additional digital control stream and coordinate operation between said digital control stream and said additional digital control stream.

5. The modulated clock as recited in claim 1 wherein said clock controller generates said controlled clock stream based on a temperature of said integrated circuit.

6. The modulated clock as recited in claim 1 wherein said digital control stream is a mask pattern.

7. The modulated clock as recited in claim 1 wherein said digital control stream is a ramp pattern.

8. The modulated clock as recited in claim 1 wherein said clock logic circuitry includes at least one AND gate.

9. The modulated clock as recited in claim 1 wherein said integrated circuit is a complementary metal-oxide semiconductor integrated circuit.

10. The modulated clock as recited in claim 3 further comprising a second clock controller and additional clock logic circuitry coupled to said second clock controller, wherein said second clock controller is configured to generate said additional digital control stream.

11. The modulated clock as recited in claim 10 wherein said modulated clock signal is provided for a first logic block of said integrated circuit and said additional modulated clock signal is provided for a second logic block of said integrated circuit, said clock controller and said second clock controller configured to coordinate data exchanged between said first and second logic blocks.

12. A method of providing a modulated clock signal for at least a portion of an integrated circuit, comprising:
receiving a clock signal having a first frequency;
generating a digital control stream; and
providing a modulated clock signal in response to said clock signal and said digital control stream, wherein said modulated clock signal has an effective frequency that is different than said first frequency and said digital control stream is a pseudo-random data stream generated to reduce harmonic frequency emissions.

13. The method as recited in claim 12 wherein said providing includes employing said digital control stream to reduce clock pulses of said clock signal to provide said modulated clock signal.

14. The method as recited in claim 13 wherein said digital control stream is a series of ones and zeros generated to reduce every other clock pulse of said clock signal.

15. The method as recited in claim 12 wherein said generating includes employing pulse code modulation to generate said digital control stream.

16. An integrated circuit, comprising:
a clock configured to generate a base clock signal having a first frequency;
a logic block of logic elements that are driven by a clock signal; and
a modulated clock, including;
a clock controller configured to generate a digital control stream; and
clock logic circuitry configured to receive said digital control stream and said base clock signal and further configured to employ said digital control stream to reduce clock pulses of said base clock signal to provide a modulated clock signal for said logic block, wherein said modulated clock signal has an effective frequency that is less than said first frequency and said digital control stream is a pseudo-random data stream generated to reduce harmonic frequency emissions.

17. The integrated circuit as recited in claim 16 further comprising at least one other logic block, said modulated clock configured to provide a distinct modulated clock signal for each of said logic blocks.

18. The integrated circuit as recited in claim 16 further comprising a temperature sensor, said clock controller employing said temperature sensor to generate said digital control stream.

19. The integrated circuit as recited in claim 16 wherein said clock controller includes a Delta-Sigma analog-to-digital converter that is employed to generate said digital control stream.

20. The integrated circuit as recited in claim 19 wherein said digital control stream is a pulse code modulation code from said Delta-Sigma analog-to-digital converter.

21. A library of standard logic elements for including in an integrated circuit, comprising:
a standard logic element corresponding to a modulated clock, including:
a clock controller configured to generate a digital control stream that is a pseudo-random data stream generated to reduce harmonic frequency emissions; and
clock logic circuitry configured to receive said digital control stream and a base clock signal having a first frequency and further configured to employ said digital control stream to reduce clock pulses of said base clock signal to provide a modulated clock signal, said modulated clock signal having an effective frequency that is less than said first frequency.

22. A modulated clock for an integrated circuit, comprising:
a clock controller configured to generate a digital control stream; and
clock logic circuitry having a first input configured to receive a clock signal having a first frequency, a second input configured to receive said digital control stream, a third input configured to receive an additional digital control stream that differs from said digital control stream and a fourth input configured to receive said clock signal, said clock logic circuitry configured to provide a modulated clock signal in response to said clock signal and said digital control stream and further configured to provide an additional modulated clock signal in response to said clock signal and said additional digital control stream, wherein said modulated clock signal and said additional modulated clock signal have an effective frequency that differs from said first frequency.

23. The modulated clock as recited in claim 22 wherein said clock controller is a pulse code modulation clock controller including an analog-to-digital converter.

24. The modulated clock as recited in claim 22 wherein said clock controller is further configured to generate said additional digital control stream and coordinate operation between said digital control stream and said additional digital control stream.

25. The modulated clock as recited in claim 22 wherein said clock controller generates said controlled clock stream based on a temperature of said integrated circuit.

26. The modulated clock as recited in claim 22 wherein said digital control stream is a mask pattern.

27. The modulated clock as recited in claim 22 wherein said digital control stream is a ramp pattern.

28. The modulated clock as recited in claim 22 wherein said clock logic circuitry includes at least one AND gate.

29. The modulated clock as recited in claim 22 wherein said integrated circuit is a complementary metal-oxide semiconductor integrated circuit.

30. An integrated circuit, comprising:
a clock configured to generate a base clock signal having a first frequency;
a logic block of logic elements that are driven by a clock signal; and
a modulated clock, including;
a clock controller configured to generate a digital control stream; and
clock logic circuitry configured to receive said digital control stream, said base clock signal and an additional digital control stream that differs from said digital control stream, said clock logic circuitry further configured to employ said digital control stream to reduce clock pulses of said base clock signal to provide a modulated clock signal and employ said additional digital control stream to reduce clock pulses of said base clock signal to provide an additional modulated clock signal for said logic block, wherein said modulated clock signal and said additional modulated clock signal have an effective frequency that is different than said first frequency.

31. A modulated clock for an integrated circuit, comprising:
   a clock controller configured to generate a digital control stream; and
   clock logic circuitry having a first input configured to receive a clock signal having a first frequency and a second input configured to receive said digital control stream, said clock logic circuitry configured to provide a modulated clock signal in response to said clock signal and said digital control stream, wherein said digital control stream is a series of ones and zeros sequenced together and said modulated clock signal has an effective frequency that differs from said first frequency.

32. The modulated clock as recited in claim 31 wherein said digital control stream is a series of ones and zeros sequenced together to effectively alter said first frequency.

* * * * *